(12) United States Patent
Yeoh et al.

(10) Patent No.: US 6,413,849 B1
(45) Date of Patent: Jul. 2, 2002

(54) INTEGRATED CIRCUIT PACKAGE WITH SURFACE MOUNTED PINS ON AN ORGANIC SUBSTRATE AND METHOD OF FABRICATION THEREFOR

(75) Inventors: Hwai-Peng Yeoh; Hamid Azimi, both of Chandler, AZ (US); Amir Nur Rashid Wagiman, Kedah (MY); Mirng-Ji Lii, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/473,447

(22) Filed: Dec. 28, 1999

(51) Int. Cl.[7] ............................................. H01L 21/44
(52) U.S. Cl. ...................... 438/612; 458/613; 458/617
(58) Field of Search ................................ 438/612, 613, 438/614, 615, 616, 617; 228/180.1, 180.2, 180.21, 180.22, 180.5; 257/696, 697, 737, 738, 780, 735, 781

(56) References Cited

U.S. PATENT DOCUMENTS

| | | | | |
|---|---|---|---|---|
| 4,634,041 A | * | 1/1987 | Prasad et al. .......... | 228/180.22 |
| 4,970,570 A | * | 11/1990 | Agarwala et al. ........... | 257/735 |
| 5,442,239 A | * | 8/1995 | DiGiacomo et al. ........ | 257/781 |
| 5,448,016 A | * | 9/1995 | DiPaolo et al. ............. | 257/735 |
| 5,640,052 A | * | 6/1997 | Tsukamoto ................. | 257/781 |
| 5,718,367 A | * | 2/1998 | Covell, II et al. ...... | 228/180.22 |
| 6,054,652 A | | 4/2000 | Moriizumi et al. ......... | 174/261 |
| 6,077,725 A | * | 6/2000 | Degani et al. .............. | 438/108 |

FOREIGN PATENT DOCUMENTS

| GB | 2324415 | 10/1998 |
|---|---|---|

\* cited by examiner

Primary Examiner—Kevin M. Picardat
(74) Attorney, Agent, or Firm—Schwegman, Lundberg, Woessner & Kluth, P.A.

(57) ABSTRACT

A method for attaching a surface mount pin to a pin pad on a substrate uses a Sn—Sb solder composition, where the quantity of Sb is in a range from 4 percent to 10 percent by weight. The Sn—Sb composition has a melting point above the melting point of commonly-used Sn—Pb solders. Thus, after the pins are surface mounted to the substrate, the pin integrity is not later compromised by assembly steps that reheat the substrate to a temperature sufficient to reflow the Sn—Pb solder. In one embodiment, the surface mount pins are attached to the bottom surface of an organic substrate using the Sn—Sb composition, and a flip-chip is attached to the top surface using Sn—Pb solder bumps. An integrated circuit package includes the substrate, the surface mount pins, and the Sn—Sb solder composition on the bonding surfaces of the pins.

16 Claims, 5 Drawing Sheets

INTEGRATED CIRCUIT PACKAGE WITH SURFACE MOUNTED PINS ON AN ORGANIC SUBSTRATE AND METHOD OF FABRICATION THEREFOR

TECHNICAL FIELD OF THE INVENTION

The present invention relates generally to the bonding of input/output electrical connection pins to a chip carrying substrate in an electronic system. More particularly, the present invention relates to surface mount bonding of input/output pins to pads on an organic substrate.

BACKGROUND OF THE INVENTION

Microprocessors and many other complex electrical components basically consist of a package that houses an integrated circuit (IC). The package, which acts as an electrical bridge between the IC and a printed circuit board, includes a substrate and an internal metallurgy system that routes power, ground, and signals between the printed circuit board and an IC attached to the substrate.

A package is typically connected to a printed circuit board using either a set of input/output pins (e.g., a "pin grid array") or solder balls (e.g., a "ball grid array"). In a pin grid array package, an array of input/output pins are connected to the bottom surface of the package. During assembly of a printed circuit board, the pin grid array is mated to a complimentary socket on the printed circuit board. One advantage to using pin grid array packages is that the package can later be removed from the printed circuit board and replaced.

Two technologies for manufacturing pin grid array packages are commonly used in the semiconductor manufacturing industry. These technologies are surface mount technology and wirebond technology. Surface mount technology involves attaching pins to pads on the bottom surface of a ceramic substrate, thus forming electrical connections with the internal package routing system.

Figure 1:
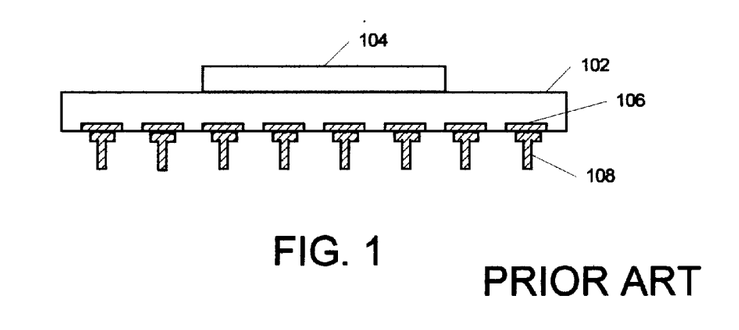
FIG. 1 illustrates a cross-sectional view of a ceramic, pin grid array integrated circuit package in accordance with the prior art.

FIG. 1 illustrates a cross-sectional view of a ceramic, pin grid array integrated circuit package in accordance with the prior art. A ceramic substrate 102 houses an integrated circuit 104 on the substrate's top surface. Attached to pin pads 106 on the bottom surface are surface mount pins 108. During manufacture of the package, the surface mount pins 108 are brazed to the substrate 102 with an alloy (e.g., Copper Zinc). Generally, this brazing process occurs at extremely high temperatures, which can be on the order of approximately 1000 degrees Celsius.

Because of the high temperatures necessary to braze the pins onto the substrate, surface mount pin technology is used in ceramic packages only. It has not been practical to use on organic packages, because an organic package would be damaged if heated to the temperature necessary to braze the pins to the substrate.

Even though pins could be soldered to pads on the bottom of an organic package using a tin-lead (Sn—Pb) solder composition, such a solution is not practical. This is because, during the component manufacturing process, it is necessary to reheat the package after the pins are attached. For example, it may be necessary to connect the IC to the package or to repair and/or rework modules that are defective or defectively joined. If the pins were merely soldered to pads on the package, the subsequent re-heating would cause the pin solder to soften or melt. This would likely result in some or all pins tilting or falling off the package.

Because organic packages cannot be heated to extremely high temperatures without becoming damaged, and because it is impractical to surface mount pins using commonly-used Sn—Pb solder, wirebond technology is generally used to create organic packages with pin grid arrays.

Figure 2:
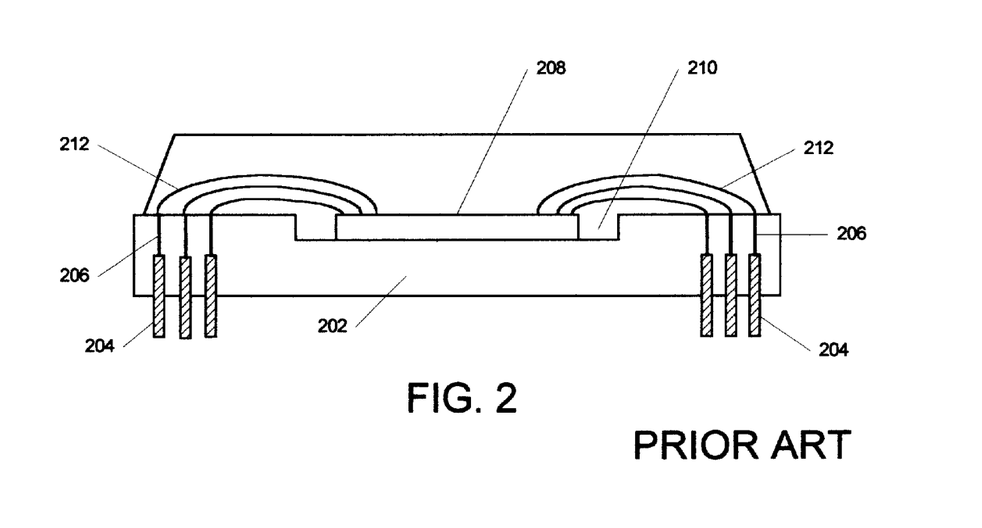
FIG. 2 illustrates a cross-sectional view of an organic, pin grid array integrated circuit package in accordance with the prior art.
Figure 3:
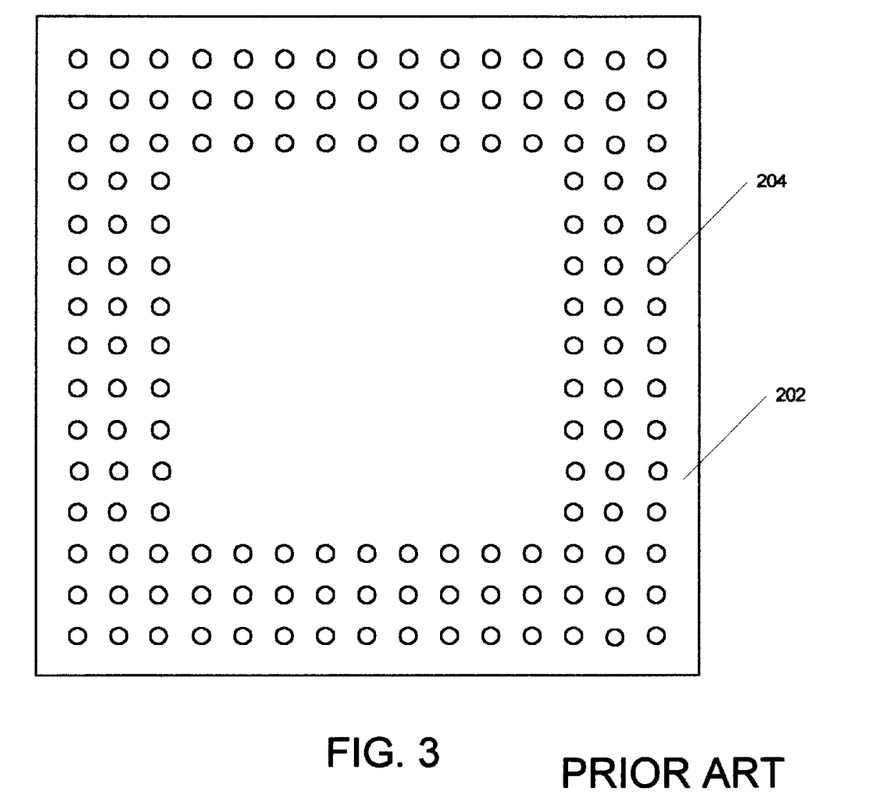
FIG. 3 illustrates a bottom view of a pin configuration for the integrated circuit package illustrated in FIG. 2.

FIG. 2 illustrates a cross-sectional view of an organic, pin grid array integrated circuit package in accordance with the prior art. The pin grid array package includes an organic substrate 202, embedded pins 204, and embedded traces 206. An IC 208 is housed in a cavity 210 on the upper surface of the substrate 202. All signal, ground, and power leads are brought to pads on the edge of the IC 208, and then gold wires 212 are used to connect these input/output pads to wirebond pads on the top surface of the substrate 202. These wirebond pads are electrically connected to embedded pins 204 via embedded traces 206. Because pins 204 are inserted into the substrate 202, they must be located around the perimeter of the substrate 202. This is necessary because the depth to which the pins 204 must be inserted into the substrate 202 precludes the pins from being located underneath the IC 208. FIG. 3 illustrates a bottom view of a pin configuration for the integrated circuit package illustrated in FIG. 2. Numerous pins 204 are shown to be inserted into the substrate 202 around its entire perimeter.

It is apparent from FIGS. 2 and 3 that one disadvantage to wirebond packages is that the package must be substantially larger than the IC that it houses, since the package must accommodate the peripheral, inserted pin grid array. In order to reduce the size of organic packages, "flip-chip" ball grid array packages are now commonly used. A "flip-chip" is a chip in which power, ground, and signal leads are brought to pads anywhere on the top surface of the chip. Sn—Pb solder bumps are then printed onto the pads, and the chip is turned upside down, and aligned with pads on the top surface of the package. When the assembly is heated to the melting point of the solder, the bumps flow together.

On the bottom of the package, a ball grid array is provided in order to attach the package to the printed circuit board. The ball grid array consists of solder balls that are attached to pads on the bottom of the package. These pads are then aligned with matching pads on the printed circuit board, and the board is heated, causing the solder to melt and form contacts between the package pads and the board pads.

Figure 4:
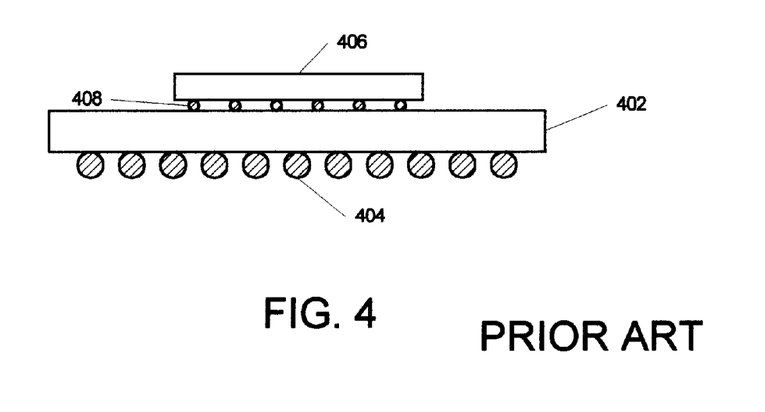
FIG. 4 illustrates a side view of a flip-chip, ball grid array integrated circuit package in accordance with the prior art.

FIG. 4 illustrates a side view of a flip-chip ball grid array package in accordance with the prior art. The package includes an organic substrate 402 having an array of solder balls 404 attached to the bottom surface of the substrate 402. An IC 406 is attached to the top surface of the substrate 402 by solder bumps 408.

Flip-chip ball grid array packages can be substantially smaller than the wirebond packages. However, one disadvantage to ball grid array packages is that they cannot be easily removed from a printed circuit board once they have been attached. Instead, if the integrated circuit becomes damaged or the consumer wishes to changed the component, the entire circuit board must be replaced.

For the reasons stated above, there is a need in the art for an organic, integrated circuit package having surface mount pins with connections that will withstand subsequent reheating steps during assembly. Further needed is a composition that can be used to attach those surface mount pins to input/output pads on the organic package. In addition, what is needed is a process for forming strong, stable bonds between surface mount pins and pads on an organic substrate.

SUMMARY OF THE INVENTION

A method for attaching a surface mount pin to a pin pad on a bottom surface of a substrate first applies solder material to the pin pad. The solder material has a composition that includes at least Sn and Sb. The surface mount pin is then placed in contact with the solder material, and the solder material is heated to its melting temperature.

An integrated circuit package has a substrate with an internal metallurgy system that electrically connects bonding pads on a top surface of the substrate to pin pads on a bottom surface of the substrate. A plurality of input/output pins are surface mounted to the pin pads using a solder material having a composition that includes at least Sn and Sb. The solder material is disposed between bonding surfaces of each of the input/output pins, thereby bonding the input/output pins to the pin pads. An integrated circuit is located on the top surface of the substrate. The integrated circuit contains a circuit which is electrically connected to the bonding pads.

A computer system positioned on a printed circuit board has a bus, a memory coupled to the bus, and an integrated circuit package coupled to the bus. The integrated circuit package has a substrate with an internal metallurgy system that electrically connects bonding pads on a top surface of the substrate to pin pads on a bottom surface of the substrate. A plurality of input/output pins are surface mounted to the pin pads with a solder material having a composition that includes at least Sn and Sb. The solder material is disposed between bonding surfaces of each of the input/output pins, thereby bonding the input/output pins to the pin pads. A microprocessor is located on the top surface of the substrate. The microprocessor contains a circuit which is electrically connected to the bonding pads.

DETAILED DESCRIPTION OF THE INVENTION

The present invention includes an integrated circuit package having surface mount pins with soldered connections that will withstand subsequent reheating steps during assembly. The present invention also includes a solder composition that can be used to attach those surface mount pins to the pin pads on the package. In addition, the present invention includes a relatively low-temperature process for forming strong, stable bonds between surface mount pins and pads on a substrate.

The most widely used solder composition is a tin-lead (Sn—Pb) solder composition. Using a composition that includes from 60 to 95 percent Sn by weight, the melting temperature of Sn—Pb solder is within a range of 190 to 230 degrees Celsius. According to the present invention, a tin-antimony (Sn—Sb) solder composition is provided, which has a melting temperature that is higher than the melting temperature of most Sn—Pb solder compositions. Therefore, after pins have been surface mounted to a package using the Sn—Sb solder composition of the present invention, the package can later be reheated in order to reflow Sn—Pb solder joints. In one embodiment, the melting temperature of the Sn—Sb solder composition is approximately 240 degrees Celsius, well above the melting temperature of Sn—Pb solder. This surface mount technology can be used to create an organic package with a pin grid array. Further, the organic package can house a flip-chip, thus providing a physically robust component with a high level of electrical performance.

Figure 5:
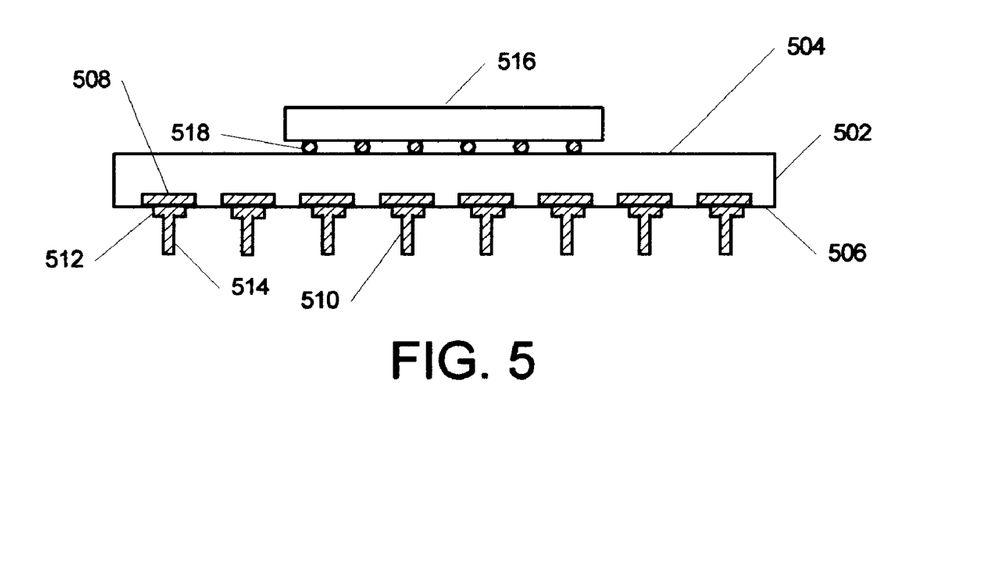
FIG. 5 illustrates a side view of an integrated circuit package with a plurality of surface mount pins attached to a substrate in accordance with one embodiment of the present invention.

FIG. 5 illustrates a side view of an integrated circuit package with a plurality of surface mount pins attached to an organic substrate in accordance with one embodiment of the present invention. The package includes an organic substrate 502 having a top surface 504 and a bottom surface 506. Substrate 502 could be any number of commonly used organic materials, such as FR-5 or FR-4 epoxy-glass, polymide-glass, benzocyclobutene, Teflon, other epoxy resins, or the like in various embodiments. Typically, the substrate 502 would have embedded therein a multilayer metallurgical system of interconnects (not shown), which electrically connect bonding pads on the top surface 504 to pin pads 508 on the bottom surface 506. FIG. 5 illustrates pin pads 508, but does not illustrate the interconnection between pads, since it is not part of the present invention, and is well known in the art.

On the bottom surface 506, surface mount pins 510 are attached, using the method and apparatus of the present invention, to pin pads 508 on the substrate 502. In one embodiment, pins 510 are butt-head pins having a flat-top head 512 and a post 514. The diameter of the pin head 512 is less than the diameter of pin pad 508, in one embodiment, in order to provide a strong solder joint, as will be explained in more detail below. The dimensions of the pad 508 and the pin head 512 can be chosen to best suit the particular application. Preferably, the outer edge of the pin head 512 is displaced inwardly from the outer edge of the pad 508 by at least 0.005 inch, more preferably in the range of 0.015 to 0.025 inch. However, displacements greater or less than this range could also be used in other embodiments.

Pins 510 are soldered to the central portions of pads 508 using a specific solder composition in accordance with the present invention. In one embodiment, the solder composition is a Sn—Sb composition with the amount of Sb in the range of 4 to 10 percent by weight. This composition has been shown to have a melting temperature that is higher than the melting temperature of Sn—Pb solder, but not so high as to cause damage to an organic substrate.

In one embodiment the composition contains approximately 5 percent Sb by weight. This composition has a melting temperature of 240 degrees Celsius, plus or minus 3 degrees. This temperature is well above the standard melting temperature of 230 degrees Celsius for a Sn—Pb composition having 95 percent Sn by weight. The composition of the present invention can include other elements as well, provided that the aforementioned melting temperature criteria are satisfied.

When the percentage of Sb by weight is less than 4 percent, the Sn—Sb solder melting temperature approaches the melting temperature of Sn—Pb solder. As explained previously, it is desirable that the Sn—Sb solder have a melting temperature that is sufficiently higher than the melting temperature of Sn—Pb, so that the Sn—Sb solder will not soften or reflow during various assembly processes.

When the percentage of Sb by weight approaches or exceeds 10 percent, the Sn—Sb solder is near the trinary point on its phase diagram. The trinary point is the point where a risk of phase separation during solder cooling is present. Phase separation occurs when a once-consistent composition separates out into multiple compositions. Each of the multiple compositions includes one or more of the same components as the original composition, but in varying percentages. For example, if the Sn—Sb solder composition included 10 percent Sb by weight, and if the cooling process was not carefully controlled, the composition could separate out into three phases, each phase having a percentage of Sb that is different from 10 percent. When phase separation occurs, the microstructure is inconsistent across the surface of the solder. Thus, when the surface is polished or etched, the surface will have portions with varying physical and electrical characteristics. Although it is possible to cool such a composition without phase separation occurring, the cooling process must be very carefully controlled, thus slowing the manufacturing process.

Referring back to FIG. 5, an IC 516 is electrically and mechanically connected to the top surface 504 of the substrate 502 via solder bumps 518. These solder bumps consist of a standard Sn—Pb solder that reflows at a temperature that is lower than the reflow temperature of the Sn—Sb solder composition of the present invention. During the assembly process, pads on the IC 516 and the package are aligned, and the solder bumps are heated to a temperature sufficient to melt the solder. The solder then flows onto adjoining pads (not shown) on the top surface 504 of the substrate 502. When cooled, the IC 516 is firmly attached to the substrate 502.

Figure 6:
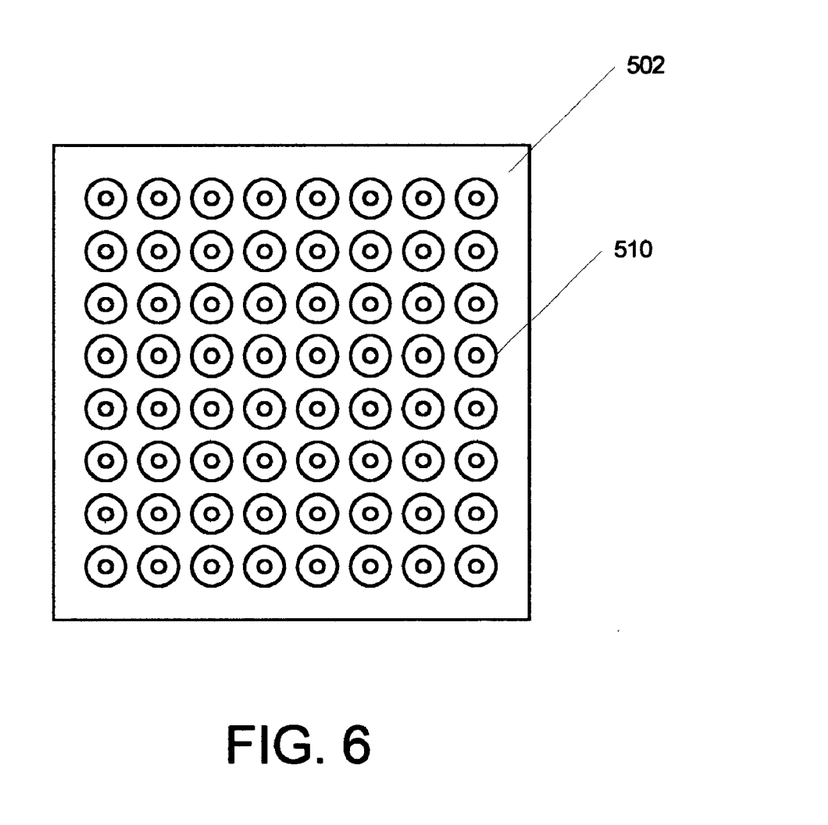
FIG. 6 illustrates a bottom view of a pin configuration for the integrated circuit package illustrated in FIG. 5.

FIG. 6 illustrates a bottom view of a pin configuration for the integrated circuit package illustrated in FIG. 5. Pins 510 are disposed across the entire area of the substrate 502. This is in contrast to the wirebond pin arrangement shown in FIG. 3, in which the pins were disposed only on the perimeter of the package. Since the pins 510 can be surface mounted in accordance with the present invention, they do not intrude into the substrate 502, and thus they can be attached below the IC.

Figure 7:
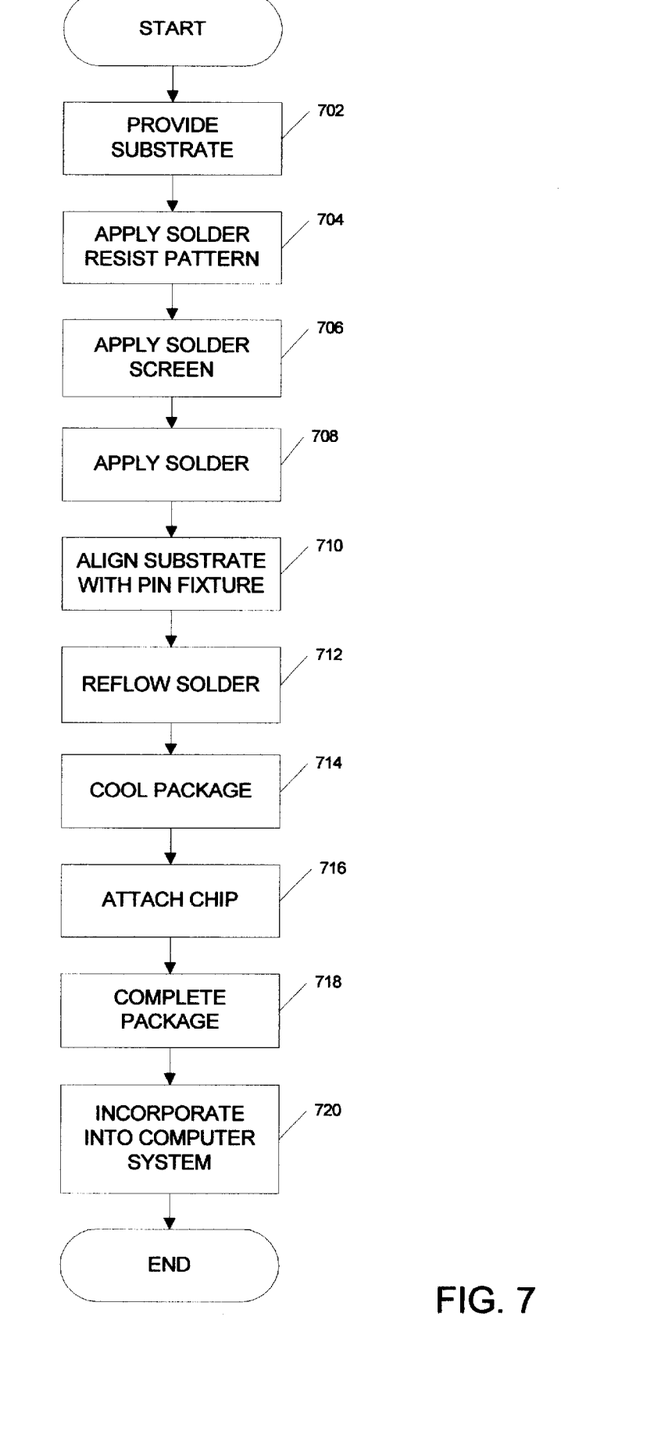
FIG. 7 illustrates a flowchart of a method for attaching a surface mount pin to a substrate in accordance with one embodiment of the present invention.

FIG. 7 illustrates a flowchart of a method for attaching a surface mount pin to a substrate in accordance with one embodiment of the present invention. The method begins, in block 702, by providing a substrate. In one embodiment, the substrate is an organic substrate having a multi-level metallurgical system of interconnects and pads. In other embodiments, the substrate can have only a single level of metallurgical connections, or can be other than an organic substrate.

In block 704, a solder resist pattern is applied to the bottom surface of the substrate. First, a solder resist material is applied. The material is then exposed, using a photolithography process well known to those of skill in the art. Unwanted resist material is then etched away, and a pattern of solder resist remains on the bottom surface of the substrate. The pattern includes regions of resist material and holes. Within the holes, the surfaces of substrate pin pads are exposed.

In block 706, a solder screen is then placed over the solder resist material. Generally, the solder screen is a metal pattern (e.g., stainless steel) having holes that line up with holes in the resist material. A solder paste is applied over the solder screen in block 708. A squeegee process is then performed, to deposit the solder paste into the holes in the solder screen, and thus the holes in the solder resist. The amount of solder deposited in each hole is a function of the size of the holes and the thicknesses of the solder screen and the solder resist. Thus, the dimensions of the holes and the thicknesses of the solder screen and the solder resist are selected based on the particular application. As will be explained below, the amount of solder deposited in each hole affects the strength of the pin connection, and also the potential for solder to wick up the pin post or otherwise interfere with a socket into which the pin is inserted.

In block 710, the solder screen is removed, and the bottom surface of the substrate is placed in aligned contact with a pin fixture that holds the pins to be soldered to the substrate. The assembly is then heated, in block 712, to a temperature sufficient to reflow the solder. As discussed previously, the Sn—Sb solder composition suitable for use in the practice of the present invention has a melting temperature that is higher than a melting temperature of Sn—Pb solder used elsewhere in the component. However, the Sn—Sb solder's melting temperature is also lower than a temperature that would damage the organic substrate.

The solder's melting temperature depends on the composition of the solder. As explained previously, in one embodiment, where the solder is a Sn—Sb composition with approximately 5 percent Sb by weight, this temperature has been experimentally determined to be approximately 240 degrees Celsius, plus or minus 3 degrees Celsius. If the composition includes a higher percentage of Sb, the melting temperature will be higher, and if the composition includes a lower percentage of Sb, the melting temperature will be lower.

In block 714, the assembly is cooled in a controlled manner, to allow the solder to solidify, and the mechanical connection of the pins to the package to be achieved. As described previously, if the composition has a greater percentage of Sb by weight, the cooling process may need to be more carefully controlled, in order to mitigate the possible effects of phase separation.

Figure 8:
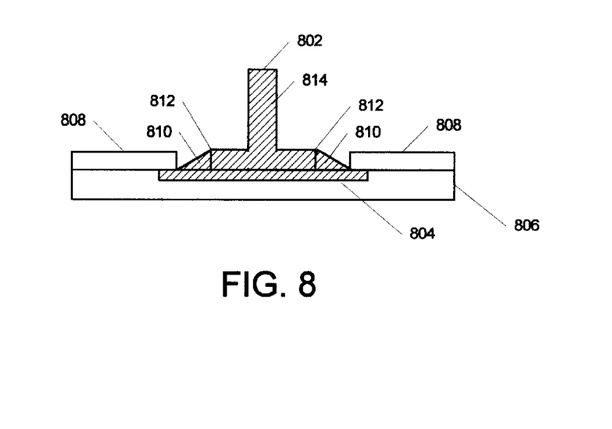
FIG. 8 illustrates a cross sectional view of a pin attached to a substrate in accordance with one embodiment of the present invention.

FIG. 8 illustrates a cross sectional view of a pin attached to a substrate in accordance with one embodiment of the present invention. As described previously, pin 802 is a butt-head type pin, which is attached to a pin pad 804 of a substrate 806. The substrate 806 is an organic substrate in one embodiment, but can be an inorganic or other substrate in other embodiments. A solder mask 808 defines the opening to the pad 804, and helps to contain a solder composition 810 that includes Sn and Sb. The solder composition 810 is disposed between bonding surfaces of pin 802, thus bonding pin 802 to the pin pad 804.

In one embodiment, the quantity of solder used to make the joint is such that the solder reaches an upper edge 812 of the pin head, but does not flow over the upper edge 812. In one embodiment, the cross-sectional top surface of the solder from the upper edge 812 to the bonding pad 804 is substantially linear. Less solder, which would not reach upper edge 812, has been shown to form a weaker joint.

More solder, which would form a shoulder and may flow over upper edge 812, may result in the solder wicking onto the post 814 of the pin, or otherwise interfering with a socket into which the pin is inserted.

Referring back to FIG. 7, once the solder composition is solidified, the package can be re-heated to melting temperatures of standard Sn—Pb solder compositions without degrading the integrity of the pin connections. Specifically, the IC chip can be attached to the top surface of the package, in block 716, using a solder reflow process.

Once the IC is attached, the package can be completed, in block 718. Completing the package typically involves hermetically sealing the top portion of the package in order to protect the IC. The completed component can then be incorporated into a computer system in block 720, and the method ends.

Figure 9:
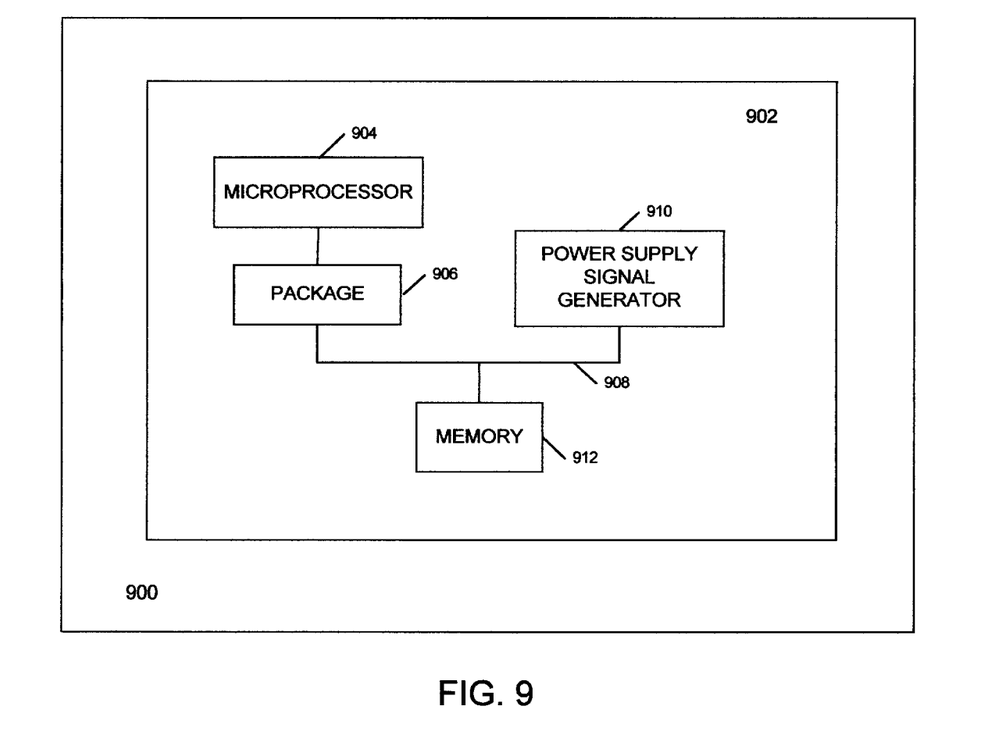
FIG. 9 illustrates a general purpose computer system in accordance with one embodiment of the present invention.

FIG. 9 illustrates a general purpose computer system in accordance with one embodiment of the present invention. Computer system 900 is housed on PC board 902, and includes bus 908, microprocessor 904, package 906, power supply signal generator 910, and memory 912. Package 906 includes surface mount pins that enable microprocessor 904 to be coupled to bus 908 through a socket on the PC board 902. These surface mount pins are soldered to package 906 using a Sn—Sb composition that has a higher melting temperature than Sn—Pb solder used elsewhere on the component. The coupling of microprocessor 904 to bus 908 via package 906 enables power supply signals and non-power supply signals to be communicated between microprocessor 904 and devices coupled to bus 908. For the embodiment of the present invention shown in FIG. 9, bus 908 couples microprocessor 904 to memory 912 and power supply signal generator 910. However, it is to be understood that in alternative embodiments of the present invention, microprocessor 904 can be coupled to memory 912 and power supply signal generator 910 through two different busses. In addition, in alternative embodiments of the present invention, power supply signal generator 910 is not positioned on PC board 902, but instead is positioned elsewhere.

CONCLUSION

Thus, various embodiments of an integrated circuit package with surface mount pins and methods of fabricating that package have been described, along with a description of the incorporation of a package on a PC board within a general purpose computer system. With the process, package configuration, and solder composition described herein, input/output pins can be bonded to a substrate with a solder composition that includes Sn and Sb. The use of a Sn—Sb solder composition provides a bond that will not be adversely affected when the assembly is later re-heated in order to reflow Sn—Pb solder deposited elsewhere in the assembly. Accordingly, input/output pins can be surface mounted to the package, facilitating smaller package sizes than can be achieved using wirebond techniques. The process also enables flip-chip technology to be used with an organic substrate and a pin grid array.

In the foregoing detailed description of the preferred embodiments, reference is made to the accompanying drawings which form a part hereof, and in which are shown by way of illustration specific preferred embodiments in which the invention may be practiced. These embodiments are described in sufficient detail to enable those skilled in the art to practice the invention.

It will be appreciated by those of ordinary skill in the art that any arrangement which is calculated to achieve the same purpose may be substituted for the specific embodiment shown. Specifically, the method and apparatus of the present invention can be used to attach surface mount pins to pads on either an organic or inorganic (e.g., ceramic) substrate. The method and apparatus specifically overcome the problems associated with attaching surface mount pins to organic substrates, however. Therefore, the description of the invention uses an organic, flip-chip pin grid array as an example. Because the method could be applied to other substrates, and to IC technologies other than flip-chip technology, these applications are intended to fall within the spirit and scope of the present invention, and the present invention should not be construed as being limited to organic, flip-chip pin grid array packages only.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the spirit and scope of the invention as expressed in the adjoining claims.

What is claimed is:

1. A method for attaching a surface mount pin to a pin pad on a bottom surface of a substrate, the method comprising:

providing an organic substrate;

applying solder material to the pin pad, wherein the solder material has a composition that includes at least Sn and Sb;

placing the surface mount pin in contact with the solder material; and heating the solder material to a melting temperature of the solder material, wherein the melting temperature of the solder material is above 230 degrees Celsius.

2. The method as claimed in claim 1, wherein applying the solder material comprises applying a solder material having a composition that includes Sb in a range of 4 percent to 10 percent by weight.

3. The method as claimed in claim 2, wherein applying the solder material comprises applying a solder material having a composition that includes approximately 5 percent Sb by weight.

4. The method as claimed in claim 1, wherein the surface mount pin is a butt-head pin, a head of the pin has an upper edge, and applying the solder material comprises applying a quantity of solder material that results in the solder reaching the upper edge after the solder material is heated.

5. The method as claimed in claim 1, wherein applying the solder material comprises:

applying a solder resist pattern to the bottom surface of the substrate, where at least a portion of the pin pad is not covered by the solder resist pattern;

applying a solder screen over the solder resist pattern, wherein the solder screen has openings that align with openings in the solder resist pattern; and using a squeegee to deposit the solder material into the openings and onto the pin pad.

6. The method as claimed in claim 1, further comprising:

cooling the solder material until it solidifies; and attaching an integrated circuit to a top surface of the substrate.

7. The method as claimed in claim 6, wherein attaching the integrated circuit comprises attaching a flip-chip to the top surface with Sn—Pb solder bumps.

8. The method as claimed in claim 1, wherein the melting temperature of the solder material is 240 degrees Celsius, plus or minus 3 degrees.

9. The method as claimed in claim 1, wherein the melting temperature of the solder material is in a range of 237 to 243 degrees Celsius.

10. The method as claimed in claim 1, wherein the melting temperature of the solder material is higher than a melting temperature of a Sn—Pb solder material with a second melting temperature in a range of 190 to 230 degrees Celsius.

11. A method for fabricating an integrated circuit package, the method comprising:

provautomobiling an organic substrate;

applying solder material to a pin pad on a bottom surface of the organic substrate, wherein the solder material has a composition that includes at least Sn and Sb;

placing the surface mount pin in contact with the solder material;

heating the solder material to a melting temperature of the solder material, wherein the melting temperature of the solder material is above 230 degrees Celsius; and cooling the solder material until it solidifies.

12. The method as claimed in claim 11, further comprising attaching an integrated circuit to a top surface of the organic substrate using a Sn—Pb solder material.

13. The method as claimed in claim 12, wherein the melting temperature of the solder material is higher than a second melting temperature of the Sn—Pb solder material.

14. The method as claimed in claim 13, herein the second melting temperature in a range of 190 to 230 degrees Celsius.

15. The method as claimed in claim 13, wherein the melting temperature of the solder material is 240 degrees Celsius, plus or minus 3 degrees.

16. The method as claimed in claim 12, wherein attaching the integrated circuit comprises attaching a flip-chip to the top surface with Sn—Pb solder bumps.

* * * * *

UNITED STATES PATENT AND TRADEMARK OFFICE
CERTIFICATE OF CORRECTION

PATENT NO. : 6,413,849 B1
DATED : July 2, 2002
INVENTOR(S) : Hwai-Peng Yeoh, Hamid Azimi, Amir Nur Rashid Wagiman and Mirng-Ji Lii It is certified that error appears in the above-identified patent and that said Letters Patent is hereby corrected as shown below:

Column 10,
Line 11, delete "herein" and insert -- wherein --, therefor.
Line 12, insert -- is -- after "temperature", therefor.

Signed and Sealed this

Nineteenth Day of November, 2002

*Attest:*

*Attesting Officer*

JAMES E. ROGAN
*Director of the United States Patent and Trademark Office*